(12) United States Patent
Borthakur et al.

(10) Patent No.: US 9,749,553 B2
(45) Date of Patent: Aug. 29, 2017

(54) IMAGING SYSTEMS WITH STACKED IMAGE SENSORS

(71) Applicant: Semiconductor Components Industries, LLC, Phoenix, AZ (US)

(72) Inventors: Swarnal Borthakur, Boise, ID (US); Ulrich Boettiger, Garden City, ID (US); Sergey Velichko, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 263 days.

(21) Appl. No.: 14/461,122

(22) Filed: Aug. 15, 2014

(65) Prior Publication Data
US 2015/0054962 A1 Feb. 26, 2015

Related U.S. Application Data

(60) Provisional application No. 61/869,473, filed on Aug. 23, 2013.

(51) Int. Cl.
| | |
|---|---|
| *H04N 5/225* | (2006.01) |
| *H04N 5/33* | (2006.01) |
| *H04N 5/369* | (2011.01) |
| *H01L 27/146* | (2006.01) |

(52) U.S. Cl.
CPC ....... *H04N 5/332* (2013.01); *H01L 27/14629* (2013.01); *H01L 27/14634* (2013.01); *H01L 27/14636* (2013.01); *H01L 27/14647* (2013.01); *H04N 5/369* (2013.01); *H01L 27/14621* (2013.01); *H01L 27/14627* (2013.01); *H01L 2224/32225* (2013.01); *H01L 2224/48091* (2013.01); *H01L 2224/48227* (2013.01); *H01L 2224/73265* (2013.01)

(58) Field of Classification Search
USPC ......................................... 348/374
See application file for complete search history.

(56) References Cited

U.S. PATENT DOCUMENTS

| | | | | |
|---|---|---|---|---|
| 5,373,182 | A | * | 12/1994 | Norton ............... H01L 27/1446 257/440 |
| 6,107,618 | A | * | 8/2000 | Fossum ............... H01L 25/167 250/208.1 |
| 7,075,079 | B2 | * | 7/2006 | Wood ..................... G01J 3/36 250/332 |

(Continued)

*Primary Examiner* — Anthony J Daniels
(74) *Attorney, Agent, or Firm* — Treyz Law Group, P.C.; Kendall W. Abbasi; Joseph F. Guihan

(57) ABSTRACT

An imaging system may include a first image sensor die stacked on top of a second image sensor die. A pixel array may include first pixels having photodiodes in the first image sensor die and second pixels having photodiodes in the second image sensor die. The first pixels may be optimized to detect a first type of electromagnetic radiation (e.g., visible light), whereas the second pixels may be optimized to detect a second type of electromagnetic radiation (e.g., infrared light). Light guide channels may be formed in the first image sensor die to help guide incident light to the photodiodes in the second image sensor substrate. The first and second image sensor dies may be bonded at a wafer level. A first image sensor wafer may be a backside illumination image sensor wafer and a second image sensor wafer may be a front or backside illumination image sensor wafer.

6 Claims, 8 Drawing Sheets

(56) References Cited

U.S. PATENT DOCUMENTS

| | | | |
|---|---|---|---|
| 8,258,560 B1 | 9/2012 | Hynecek | |
| 2007/0138588 A1* | 6/2007 | Wilson | H01L 31/02240 257/458 |
| 2009/0008730 A1* | 1/2009 | Roy | H01L 27/14621 257/432 |
| 2009/0134439 A1* | 5/2009 | Kim | H01L 27/14634 257/294 |
| 2009/0200589 A1* | 8/2009 | Qian | H01L 27/14603 257/292 |
| 2010/0065896 A1* | 3/2010 | Lee | H01L 27/1463 257/292 |
| 2010/0157117 A1 | 6/2010 | Wang | |
| 2011/0242390 A1* | 10/2011 | Sogoh | H01L 27/14609 348/311 |
| 2012/0043636 A1* | 2/2012 | Nagata | H01L 27/14623 257/435 |
| 2013/0075607 A1 | 3/2013 | Bikumandla et al. | |
| 2013/0076910 A1* | 3/2013 | Scott | H04N 5/332 348/164 |
| 2013/0234029 A1* | 9/2013 | Bikumandla | H01L 25/043 250/349 |
| 2014/0264683 A1* | 9/2014 | Kao | H01L 27/14641 257/431 |

* cited by examiner

40

| A | A | A | B | A |
|---|---|---|---|---|
| A | B | A | A | A |

⋮

| B | A | B | B | A |
|---|---|---|---|---|

FIG. 7

IMAGING SYSTEMS WITH STACKED IMAGE SENSORS

This application claims the benefit of provisional patent application No. 61/869,473, filed Aug. 23, 2013, which is hereby incorporated by reference herein in its entirety.

BACKGROUND

This relates generally to imaging systems and, more particularly, to imaging systems with stacked image sensors.

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals.

In a typical arrangement, an imaging system includes a single image sensor with a single array of image sensing pixels. It can be challenging, however, to detect different types of electromagnetic radiation using a single image sensor. For example, it can be challenging to design a single image sensor that can detect and distinguish between visible light and infrared light. Some image sensors include pixel arrays with visible imaging pixels that are sensitive to visible light and infrared pixels that are sensitive to infrared light. However, because these imaging pixels are fabricated in a single image sensor die, it can be difficult to fabricate the image sensor die using materials that are optimized for both visible and infrared imaging.

Some imaging systems include multiple image sensors, each having a separate array of image sensing pixels that is optimized to detect a particular type of electromagnetic radiation. This type of system typically includes multiple image sensor dies arranged laterally adjacent to one another, consuming valuable real estate in an electronic device and adding undesirable bulk to the electronic device.

It would therefore be desirable to provide improved imaging systems for detecting different types of electromagnetic radiation.

BRIEF DESCRIPTION OF THE DRAWINGS

FIG. 7 is a top view of an illustrative pixel array having pixels associated with a first image sensor in a stack of image sensors and having pixels associated with a second image sensor in the stack of image sensors in accordance with an embodiment of the present invention.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
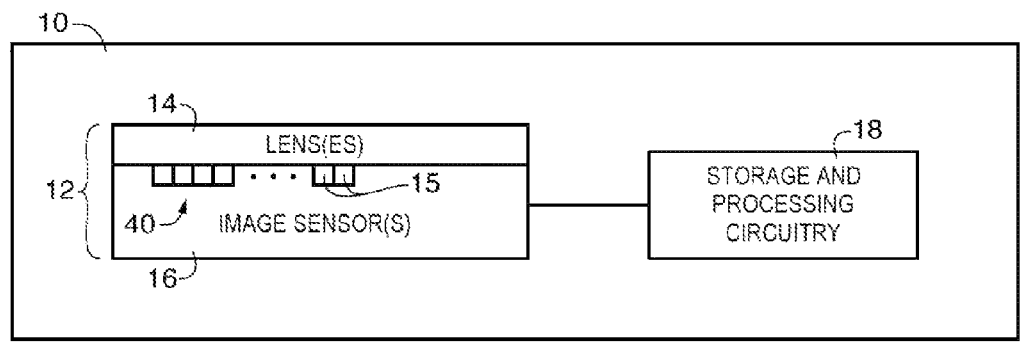
FIG. 1 is a diagram of an illustrative imaging system that may include a camera module having an image sensor in accordance with an embodiment of the present invention.

FIG. 1 is a diagram of an illustrative electronic device that uses one or more image sensors to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. If desired, camera module 12 may be provided with an array of lenses 14 and an array of corresponding image sensors 16. Each image sensor 16 may include an image pixel array 40 with an array of image sensor pixels 15. Image sensors 16 may include one or more backside illumination (BSI) image sensors and/or one or more front side illumination (FSI) image sensors.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
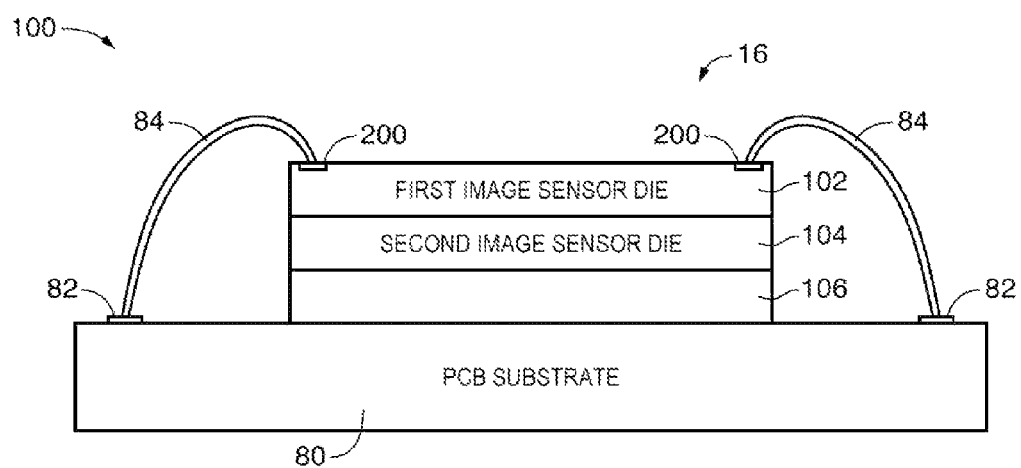
FIG. 2 is a diagram of an illustrative imaging system that includes a first image sensor die stacked on top of a second image sensor die in accordance with an embodiment of the present invention.

Camera module 12 may include multiple image sensors stacked on top of one another. FIG. 2 shows an illustrative imaging system 100 that includes multiple image sensors 16 such as first image sensor die 102 and second image sensor die 104. First image sensor die 102 (sometimes referred to as upper image sensor die 102) may be stacked on top of second image sensor die 104 (sometimes referred to as lower image sensor die 104), which may in turn be stacked on top of one or more additional dies 106. For example, layer 106 may be an additional image sensor die, may be two or more additional stacked image sensor dies, or may be a signal processing die having processing circuitry that processes image data (e.g., still and/or video data) from image sensor dies 102 and 104 (e.g., layer 106 may be a digital signal processor).

Image sensor dies 102 and 104 may be front side illumination image sensors or backside illumination image sensors. For example, first image sensor die 102 may be a backside illumination image sensor and second image sensor die 104 may be a front side illumination image sensor; first image sensor die 102 may be a front side illumination image sensor and second image sensor die 104 may be a backside illumination image sensor; first and second image sensor dies 102 and 104 may both be backside illumination image sensors; or first and second image sensor dies 102 and 104 may both be front side illumination image sensors.

Image sensor dies 102 and 104 may each include a plurality of photosensitive elements that are used in producing image data (i.e., still or video data). Image data produced by image sensor dies 102 and 104 may be fed to signal processing circuitry (e.g., signal processing die 106) for further processing.

As shown in FIG. 2, the stacked dies may be mounted on a substrate such as printed circuit board (PCB) substrate 80. Bond pads 200 may be formed on upper image sensor die 102. Bond pads 200 may be coupled to contacts 82 or other conductive structures on PCB 80 via bond wires 84. In general, data and control signals may be conveyed between the stacked dies and other components on substrate 80 via bonding wires 84.

If desired, image sensor dies 102 and 104 may be used to detect different types of electromagnetic radiation (e.g., different ranges of wavelengths of light). For example, upper image sensor die 102 may be optimized to detect visible light, whereas lower image sensor die 104 may be optimized to detect infrared light. This is, however, merely illustrative. If desired, upper image sensor die 102 and image sensor die 104 may both be used to detect visible light, upper image sensor die 102 and image sensor die 104 may both be used to detect infrared light, upper image sensor die 102 may be used to detect a first range of wavelengths in the visible spectrum while lower image sensor die 104 may be used to detect a second range of wavelengths in the visible spectrum, etc. In general, image sensor dies 102 and 104 may each be configured to detect any suitable range of wavelengths of light. Arrangements in which upper image sensor die 102 is optimized to detect visible light and lower image sensor die 104 is optimized to detect infrared light are sometimes described herein as an illustrative example.

Figure 3:
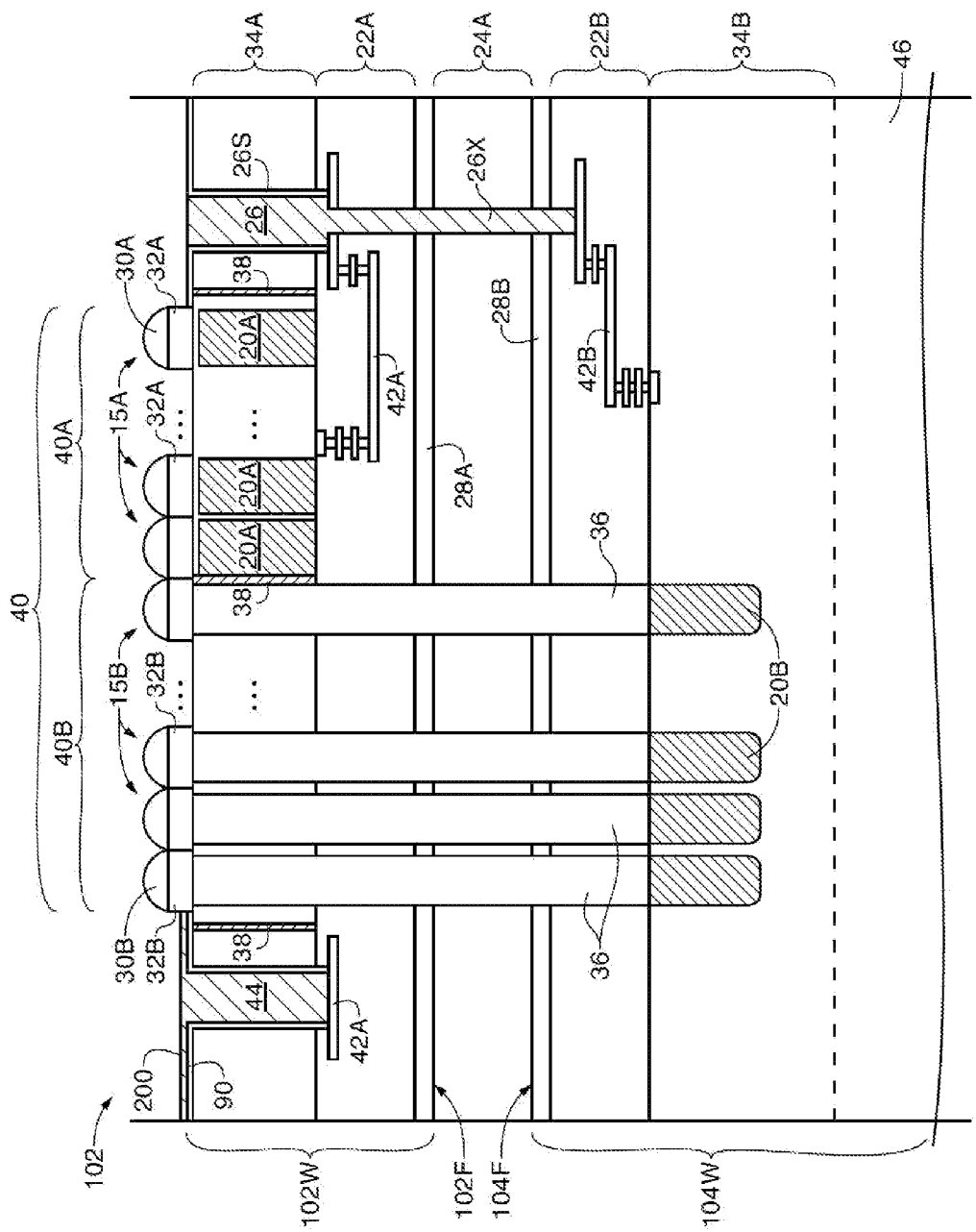
FIG. 3 is a cross-sectional side view of a backside illumination image sensor wafer stacked on top of a front side illumination image sensor wafer in accordance with an embodiment of the present invention.

Upper image sensor die 102 and lower image sensor die 104 may, if desired, be bonded together at the wafer level. For example, a first wafer containing multiple image sensors 102 may be bonded to and interconnected with a second wafer containing multiple image sensors 104. The bonded first and second wafers may subsequently be diced into individual image sensors 16 (e.g., of the type shown in FIG. 2), each having an upper image sensor die 102 and a lower image sensor die 104. This is, however, merely illustrative. If desired, upper image sensor die 102 and lower image sensor die 104 may be bonded together at a die-level (e.g., upper image sensor die 102 may be cut from a first wafer, lower image sensor die 104 may be cut from a second, separate wafer, and the individual dies 102 and 104 may be subsequently bonded to and interconnected with each other). Arrangements in which upper image sensor die 102 and lower image sensor die 104 are bonded at the wafer level are sometimes described herein as an illustrative example, FIG. 3 is a cross-sectional side view of a portion of an upper image sensor wafer 102W and lower image sensor wafer 104W. In the example of FIG. 3, upper image sensor wafer 102W includes multiple backside illumination image sensors 102 and lower image sensor wafer 104W includes multiple front side illumination image sensors 104. Oxide layer 24A may be used to bond front surface 102F of image sensor wafer 102W to front surface 104F of image sensor wafer 104W. In a front side illumination image sensor, circuitry such as metal interconnect circuitry may be interposed between the microlens array and photosensitive regions of an image sensor. In a backside illumination image sensor, the photosensitive regions are interposed between the microlens array and the metal interconnect circuitry of the image sensor.

Upper image sensor wafer 102 may include a substrate such as substrate 34A having a front surface and a back surface and interconnect routing layers 22A formed on the front surface of substrate 34A. A passivation layer such as nitride layer 28A may be formed on dielectric layer 22A at front surface 102F. Substrate 34A may be a semiconductor substrate (e.g., an epitaxial silicon layer). Layers 22A may include alternating metal routing layers and via layers (e.g., routing structures formed in an oxide layer or other dielectric material) and may sometimes be referred to as an intermetal dielectric layer, an intermetal dielectric stack, an interconnect stack, or an interlayer dielectric (ILD). Photosensitive elements such as photodiodes 20A may be formed in substrate 34A.

Lower image sensor wafer 104 may include a substrate such as substrate 34B having a front surface and a back surface and interconnect routing layers 22B formed on the front surface of substrate 34B. A passivation layer such as nitride layer 28B may be formed on dielectric layer 22B at front surface 104F. Substrate 34B may be a semiconductor substrate (e.g., an epitaxial silicon layer grown on a silicon carrier wafer such as bulk silicon layer 46). Layers 22B may include alternating metal routing layers and via layers (e.g., routing structures formed in an oxide layer or other dielectric material) and may sometimes be referred to as an intermetal dielectric layer, an intermetal dielectric stack, an interconnect stack, or an interlayer dielectric (ILD). Photosensitive elements such as photodiodes 20B may be formed in substrate 34B.

As shown in FIG. 3, image pixel array 40 may include pixels 15A in a first region 40A and pixels 15B in a second region 40B. Pixels 15A may include photodiodes 20A formed in upper image sensor wafer 102W, whereas pixels 15B may include photodiodes 20B formed in lower image sensor wafer 104W. Pixel array 40 may include an array of microlenses and an array of filter elements. For example, pixels 15A may include filter elements 32A interposed between microlenses 30A and photodiodes 20A, and pixels 15B may include filter elements 32B interposed between microlenses 30B and photodiodes 20B. Each microlens 30A may focus incident light onto a respective one of photodiodes 20A, and each microlens 30B may focus incident light onto a respective one of photodiodes 20B.

Pixels 15B may include light guide structures 36 to help guide light that is focused by microlenses 30B to photodiodes 20B. Light guide structures 36 may, if desired, be formed from hollowed channels that pass through layers 34A, 22A, 28A, 24A, 28B, and 22B. Channels 36 may be filled with a light guide material such as organo-siloxane-based polymer materials, silicon nitride, silicon carbide, air, or other suitable materials (e.g., materials having a higher index of refraction than the surrounding dielectric material). If desired, the walls that define light guide channels 36 may be lined with a material having a lower index of refraction than the material that fills channels 36.

Light guide channels 36 may, if desired, be formed after upper wafer 102W is bonded to lower wafer 104W. For example, after upper wafer 102W is bonded to lower wafer 102W, openings may be etched in layers 34A, 22A, 28A, 24A, 28B, and 22B to form channels 36. The sidewalls of channels 36 may be passivated and, if desired, channels 36 may be filled with a light guide material.

If desired, microlenses 30B over photodiodes 20B may be different from microlenses 30A over photodiodes 20A. For example, the size, material, and/or radius of curvature of microlenses 30B may be adjusted to accommodate the path length that light must travel through channels 36 to reach photodiodes 20B. This is, however, merely illustrative. If desired, microlenses 30A and 30B may have similar structure.

As shown in FIG. 3, inter-die via structures such as via structure 26 may traverse through at least a portion of die 102 and die 104. Via structures 26 may be electrically coupled to circuitry within die 102 and to circuitry within die 104. For example, via structure 26 may connect to metal routing structures 42A in image sensor die 102 and to metal routing structures 42B in image sensor die 104. Via 26 may have a first portion such as portion 26S passing through silicon substrate 34A and a second portion such as portion 26X passing through oxide layers 22A, 24A, and 22B. Vias that pass through silicon such as portion 26S of via 26 are sometimes referred to as through-silicon vias (TSVs). Vias that pass through oxide such as portion 26X of via 26 are sometimes referred to as through-oxide vias (TOVs).

Additional via structures such as via structure 44 may be formed in upper image sensor wafer 102W. Via structure 44 may be used to electrically couple circuitry in image sensor dies 102 and 104 to a substrate (e.g., PCB substrate 80 of FIG. 2) via bond pad 200 (e.g., a wirebond pad). Bond pad 200 may be formed from aluminum, copper, silver, gold, a combination of these materials, or other suitable conductive materials. If desired, via structure 26 may be formed using the same material that is used to form bond pad 200, or via structure 26 and bond pad 200 may be formed from different materials.

Via structures such as vias 26 and 44 may be formed by etching openings in wafer 102 and/or wafer 104 and by subsequently depositing conductive material (e.g., copper, aluminum, tungsten, silver, gold, a combination of these materials, or other suitable conductive material) into the openings. An isolation layer such as dielectric layer 90 may be used to isolate via structures 26 and 44 from silicon substrate 34A.

If desired, filter elements 32A may have different spectral characteristics than filter elements 32B. For example, in arrangements where image sensor 102 is used for visible imaging and image sensor 104 is used for infrared imaging, filter elements 32A may be color filter elements that are optimized to transmit wavelengths in the visible spectrum, and filter elements 32B may be infrared filter elements that are optimized to transmit infrared light while blocking visible light. This is, however, merely illustrative. In general, filter elements 32A and 32B may have any suitable transmission characteristics. For example, filter elements 32A and 32B may include red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), broadband filter elements (e.g., filter material that passes two or more colors of light selected from the group that includes red light, blue light, and green light), and/or color filter elements of other colors (e.g., cyan, magenta, etc.).

By providing pixels 15A and pixels 15B with filter elements having different spectral characteristics, the pixels 15A of image sensor wafer 102 may be used to detect a first type of electromagnetic radiation (e.g., visible light), while pixels 15B of image sensor wafer 104 may be used to detect a second type of electromagnetic radiation (e.g., infrared light). This in turn allows a single pixel array 40 to be used for detecting two or more different types of electromagnetic radiation. By separating the photosensitive elements of one type of detector from the photosensitive elements of another type of detector (e.g., by separating the photosensitive elements into multiple layers), materials and processing steps can be customized for each detector type. For example, substrate 34B of infrared imaging sensor 104 may be formed from a material that is more conducive to infrared light detection than the material used for substrate 34A of visible imaging sensor 102 (e.g., a III-V semiconductor material, germanium, silicon-germanium, inorganic materials, other suitable materials, etc.).

If desired, photodiodes 20B of infrared imaging pixels 15B may be larger than photodiodes 20A of visible imaging pixels 15A. For example, a ratio of the size of photosensitive regions 20B to the size of photosensitive regions 20A may be 2:1, 3:1, 4:1, 16:1, or any other suitable ratio. In this type or arrangement, light guide channels 36 may be enlarged to form an infrared window through which infrared light can pass to reach infrared sensing area 20B. This is, however, merely illustrative. If desired, infrared light sensing regions 20B and visible light sensing regions 20A may have the same size.

If desired, pixels 15A and pixels 15B may be optically and/or electrically isolated from each other using isolation structures 38. Isolation structures 38 may be formed from dielectric material (e.g., oxide or other suitable dielectric material) and may help prevent crosstalk between pixels 15A and pixels 15B. If desired, isolation structures 38 may be opaque to certain ranges of wavelengths (e.g., isolation structures 38 may be formed from opaque polymer such as black photoresist).

In the illustrative example of FIG. 3, isolation structures 38 extend from one surface of substrate 34A to an opposing surface of substrate 34A. This is, however, merely illustrative. If desired, isolation structures 38 may extend only partially through substrate 34.

Figure 4:
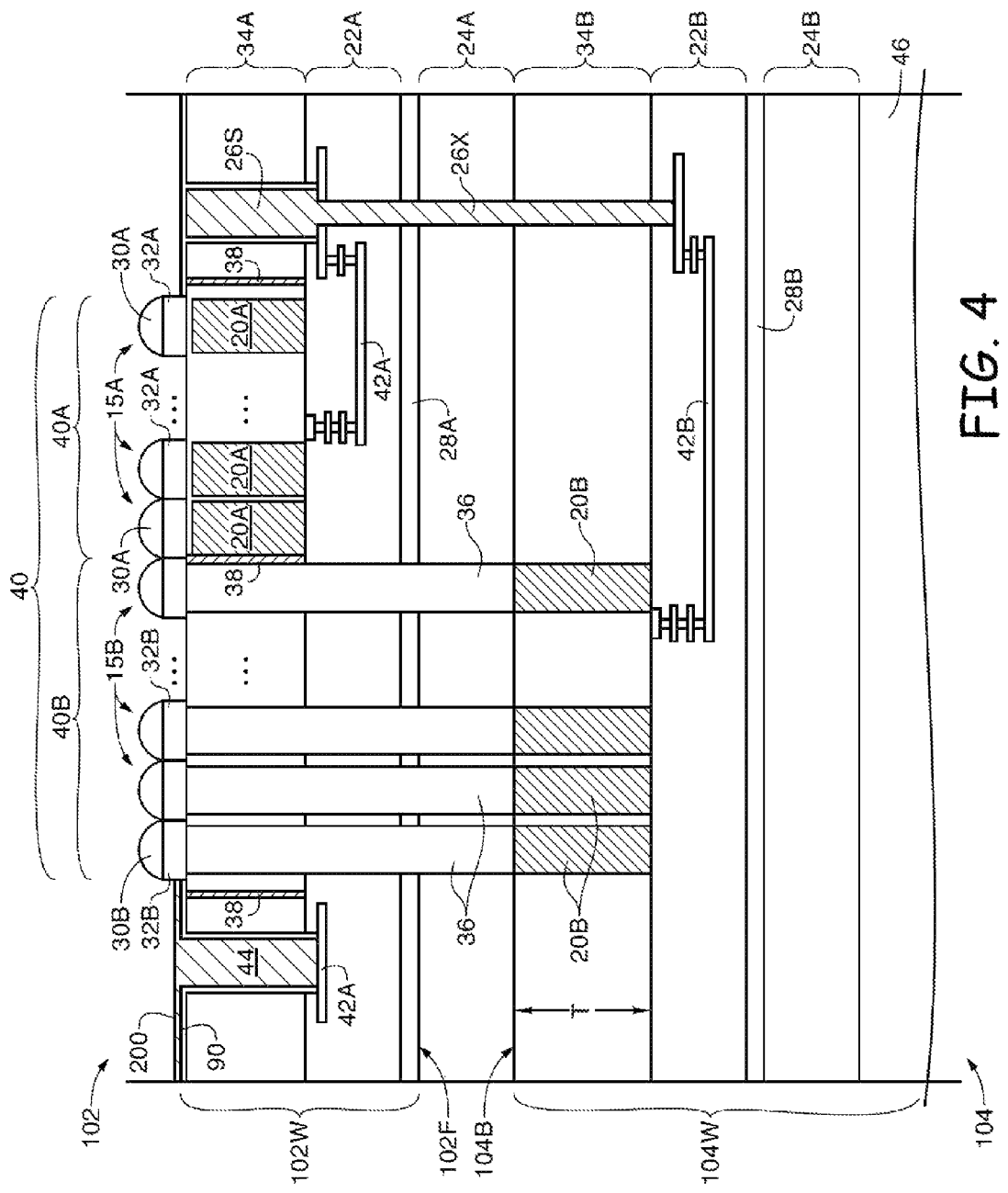
FIG. 4 is a cross-sectional side view of a backside illumination image sensor wafer stacked on top of a backside illumination image sensor wafer in accordance with an embodiment of the present invention.

FIG. 4 is a cross-sectional side view of a portion of an upper image sensor wafer 102W and lower image sensor wafer 104W according to another suitable arrangement. In the example of FIG. 4, upper image sensor wafer 102W includes multiple backside illumination image sensors 102 and lower image sensor wafer 104W includes multiple backside illumination image sensors 104. Oxide layer 24A may be used to bond front surface 102F of image sensor wafer 102W to back surface 104B of image sensor wafer 104W.

With this type of arrangement, upper image sensor wafer 102 has a similar configuration to that shown in FIG. 3. Lower image sensor wafer 104 may include a substrate such as substrate 34B having a front surface and a back surface and interconnect routing layers 22B formed on the front surface of substrate 34B. A passivation layer such as nitride layer 28B may be formed on dielectric layer 22B. In the arrangement of FIG. 4, interconnect layer 22B is interposed between epitaxial layer 34B and bulk silicon layer 46 (e.g., a permanent silicon layer that forms a carrier for image sensor dies 102 and 104). An oxide layer such as oxide layer 24B may be interposed between interconnect layer 22B and bulk silicon layer 46. If desired, the thickness T of epitaxial layer 34B of wafer 104W may be larger than that of epitaxial layer 34A of wafer 102W.

Figure 5:
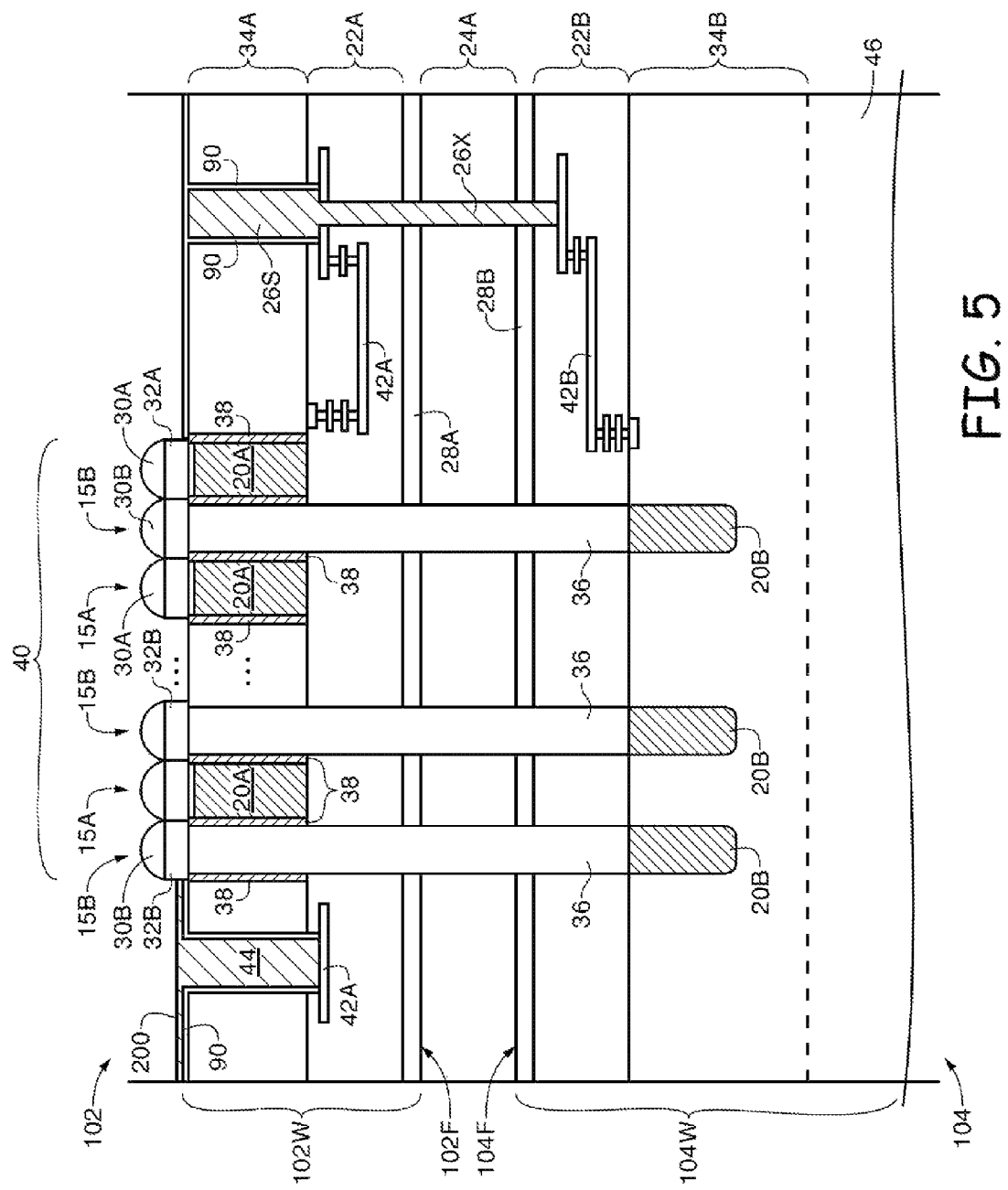
FIG. 5 is a cross-sectional side view of a backside illumination image sensor wafer stacked on top of a front side illumination image sensor wafer, where pixels associated with the backside illumination image sensor wafer are interspersed with pixels associated with pixels associated with the front side illumination image sensor wafer in accordance with an embodiment of the present invention.

FIG. 5 is a cross-sectional side view of a portion of an upper image sensor wafer 102W and lower image sensor wafer 104W according to another suitable arrangement. In the example of FIG. 5, upper image sensor wafer 102W includes multiple backside illumination image sensors 102 and lower image sensor wafer 104W includes multiple front side illumination image sensors 104 (e.g., similar to the example of FIG. 3). In the example of FIG. 5, however, individual pixels 15B are interspersed with pixels 15A. For example, a single infrared imaging pixel 15B may be interposed between a pair of adjacent visible imaging pixels 15A.

If desired, isolation structures such as isolation structures 38 may be interposed between each pair of visible and infrared imaging pixels.

Figure 6:
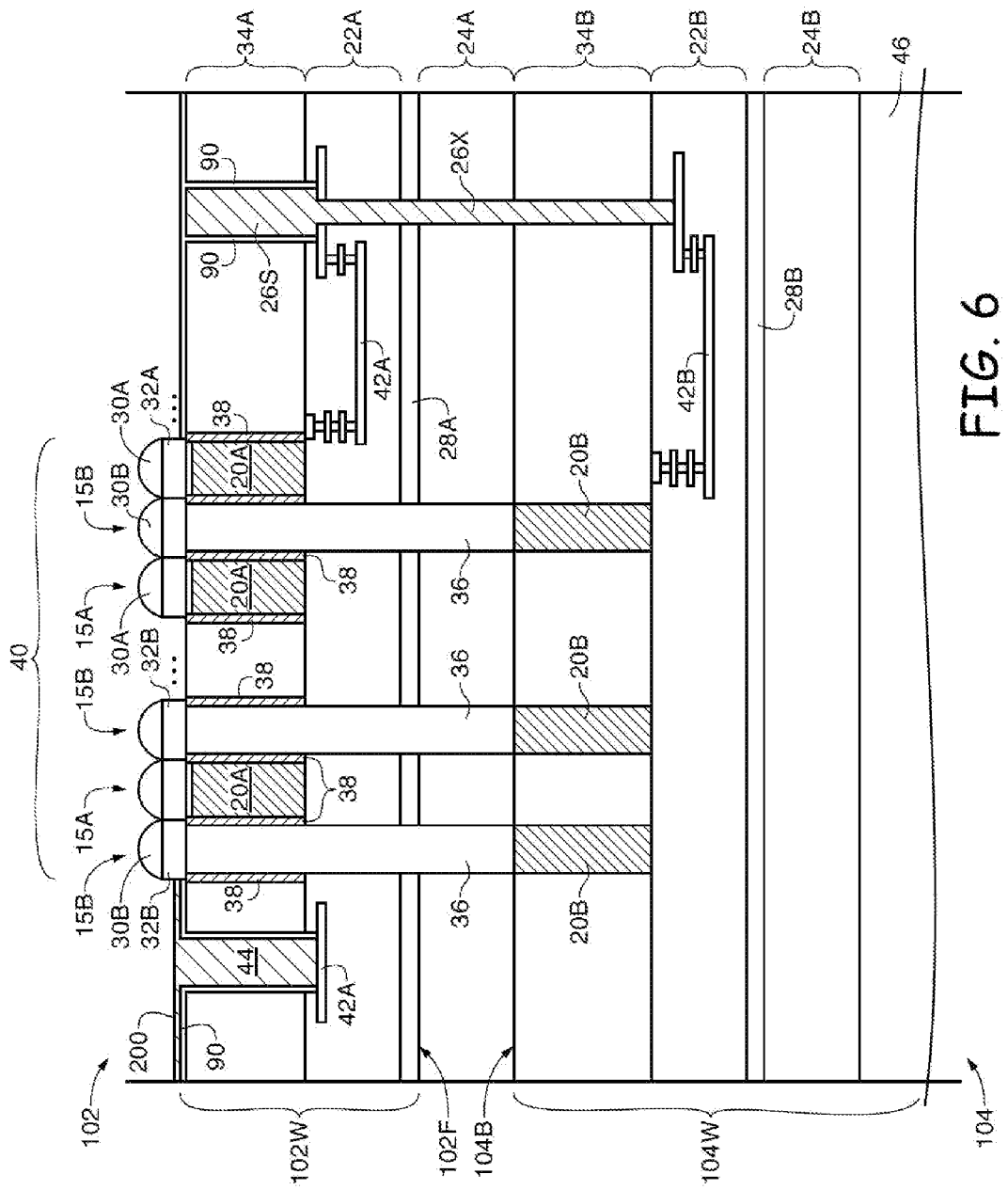
FIG. 6 is a cross-sectional side view of a first backside illumination image sensor wafer stacked on top of a second backside illumination image sensor wafer, where pixels associated with the first backside illumination image sensor wafer are interspersed with pixels associated with the second backside illumination image sensor wafer in accordance with an embodiment of the present invention.

FIG. 6 is a cross-sectional side view of a portion of an upper image sensor wafer 102W and lower image sensor wafer 104W according to another suitable arrangement. In the example of FIG. 6, upper image sensor wafer 102W includes multiple backside illumination image sensors 102 and lower image sensor wafer 104W includes multiple backside illumination image sensors 104 (e.g., similar to the example of FIG. 4). In the example of FIG. 6, however, individual pixels 15B are interspersed with pixels 15A. For example, a single infrared imaging pixel 15B may be interposed between a pair of adjacent visible imaging pixels 15A.

If desired, isolation structures such as isolation structures 38 may be interposed between each pair of visible and infrared imaging pixels.

Figure 7:
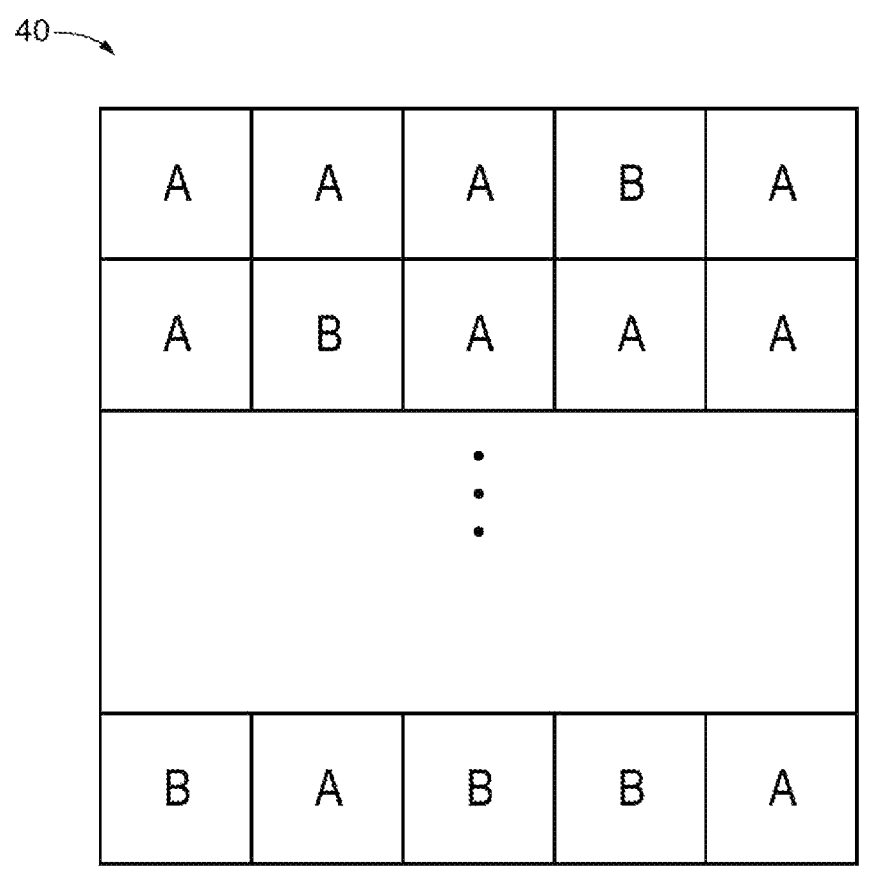

The examples of FIGS. 3-6 are merely illustrative. In general, pixels 15A having photosensitive elements in upper image sensor wafer 102W and pixels 15B having photosensitive elements in lower image sensor wafer 104W may be arranged with respect to each other in any suitable fashion. A top view of one illustrative arrangement for pixel array 40 is shown in FIG. 7. Regions marked with an "A" in FIG. 7 may correspond to regions of pixel array 40 with one or more pixels 15A, whereas regions marked with a "B" may correspond to regions of pixel array 40 with one or more pixels 15B. Each region A may include one visible imaging pixel, four or more visible imaging pixels, or an array of any suitable number of visible imaging pixels. Each region B may include one infrared imaging pixel, four or more infrared imaging pixels, or an array of any suitable number of infrared imaging pixels. As described above in connection with FIG. 2, pixels 15A and 15B may have any suitable spectral sensitivity. The use of visible and infrared imaging pixels is merely illustrative.

Figure 8:
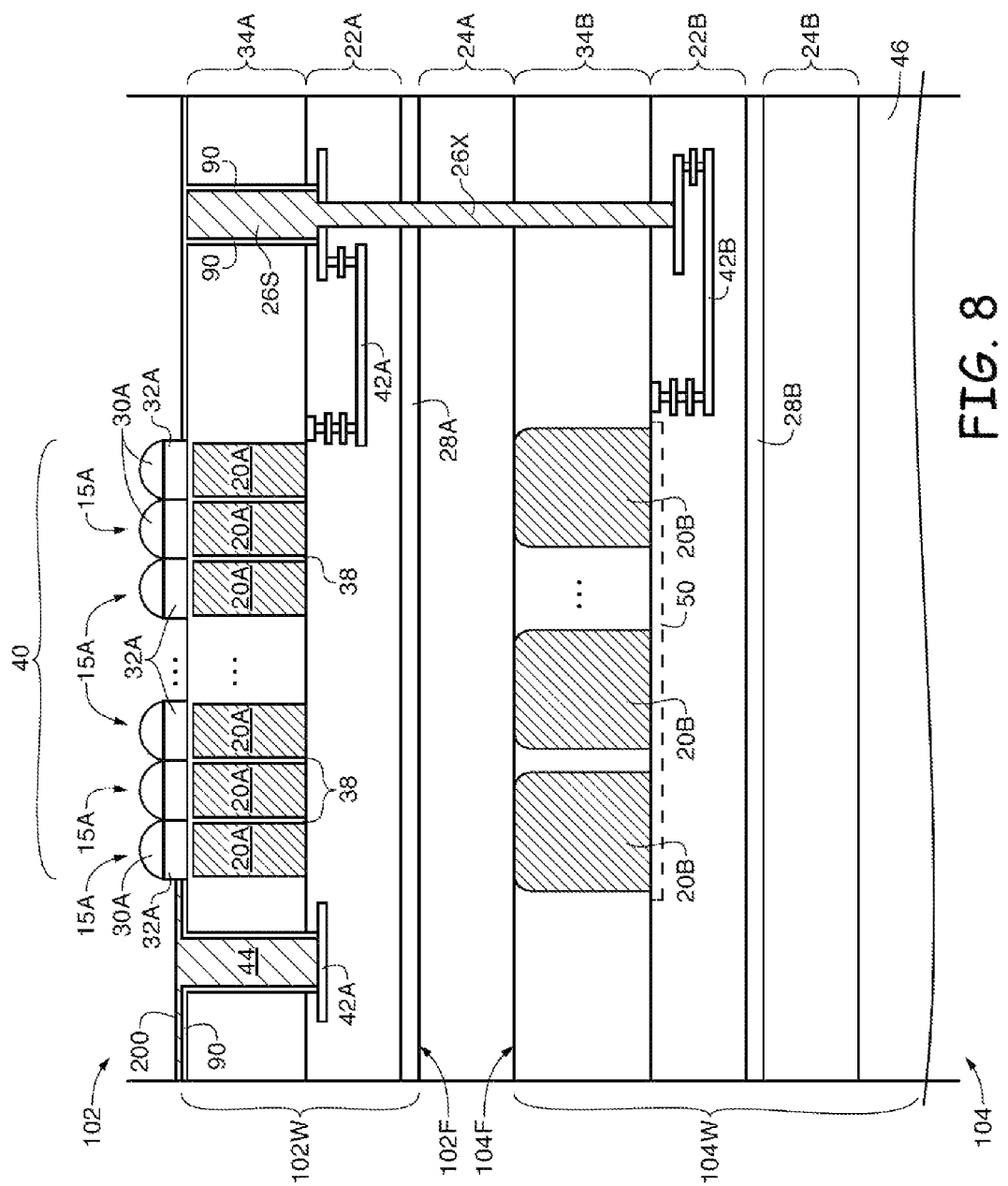
FIG. 8 is a cross-sectional side view of a first image sensor wafer stacked on top of a second image sensor wafer, where photodiodes associated with the second image sensor wafer are formed directly below photodiodes associated with the first image sensor wafer in accordance with an embodiment of the present invention.

If desired, lower image sensor 104 may be used to detect transmitted radiation that is not absorbed in upper epitaxial silicon 34A. This type of arrangement is shown in FIG. 8. As shown in FIG. 8, photodiodes 20B of lower image sensor wafer 104W are formed directly under photodiodes 20A of upper image sensor wafer 102W. Rather than etching openings through upper image sensor wafer 102W to channel light to photodiodes 20B of lower image sensor wafer 104W, photodiodes 20B may be used to absorb any radiation that is transmitted through upper image sensor wafer 102W without being absorbed by photodiodes 20A. If desired, a reflective layer such as metal reflector 50 may be formed under photodiodes 20B to help reflect photons upwards towards photodiodes 20B. Image data gathered by photodiodes 20B of lower image sensor wafer 104W may be combined with image data gathered by photodiodes 20A or may be used in any other suitable manner.

The example of FIG. 8 in which both upper image sensor 102 and lower image sensor 102 are backside illuminated image sensors is merely illustrative. If desired, upper image sensor 102 may be a backside illumination image sensor and lower image sensor 104 may be a front side illumination image sensor (as an example).

Figure 9:
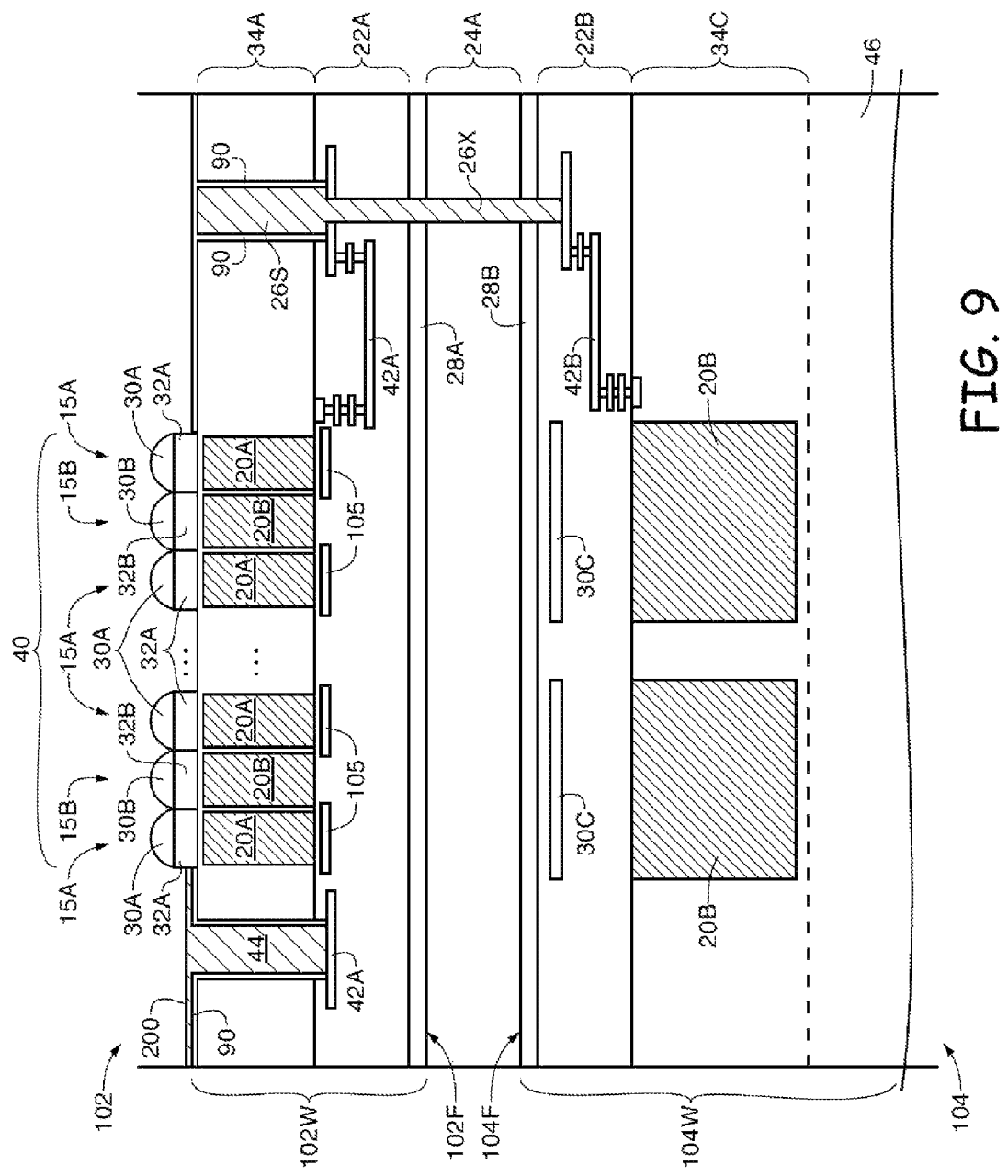
FIG. 9 is a cross-sectional side view of a backside illumination image sensor wafer stacked on top of a front side illumination image sensor wafer, where larger photodiodes associated with the second image sensor wafer are formed directly below photodiodes associated with the first image sensor wafer and where the backside illumination image sensor wafer includes both visible and infrared imaging pixels in accordance with an embodiment of the present invention.

FIG. 9 is a cross-sectional side view of a portion of an upper image sensor wafer 102W and lower image sensor wafer 104W according to another suitable arrangement. In the example of FIG. 9, upper image sensor wafer 102W includes multiple backside illumination image sensors 102 and lower image sensor wafer 104W includes multiple front side illumination image sensors 104 (e.g., similar to the example of FIG. 3). In the example of FIG. 9, individual pixels 15B are surrounded with pixels 15A. For example, a single infrared imaging pixel 15B may be surrounded by adjacent visible imaging pixels 15A.

In this example, pixels 15A include photodiodes 20A in upper image sensor wafer 102W, whereas pixels 15B include photodiodes 20B in upper image sensor wafer 102W and photodiodes 20B in lower image sensor wafer 104W. Photodiodes 20B in lower image sensors wafer 104W may be located directly below photodiodes 20B in upper image sensor wafer 102W and may, if desired, be larger in size than photodiodes 20B in upper image sensor wafer 102W. Visible imaging pixels 15A may include a reflector such as reflector 105 formed directly below photodiodes 20A to reflect visible light back towards photodiodes 20A and to minimize crosstalk with infrared imaging pixels 15B.

If desired, reflectors such as reflectors 105 may be located below only some of visible imaging pixels 15A. For example, visible imaging pixels 15A may include red, green, and blue imaging pixels, and reflectors may be located only under the red and green imaging pixels (as an example).

Blue imaging pixels without reflectors 105 may directly overlap infrared imaging pixels.

Infrared imaging pixels may include two layers of color filter elements. For example, as shown in FIG. 9, upper photodiodes 20B may be covered with a first filter element 30B, whereas lower photodiodes 20B may be covered with a second filter element 30C. If desired, filter elements 30B and 30C may have the same spectral response or may have different spectral responses. For example, filter 30B may be a wide-band near-infrared filter or a clear filter, and filter 30C may be a narrow-band near-infrared filter (e.g., a filter having a narrow passband centered around 850 nm, 940 nm, or any other targeted wavelength). As another example, filters 30B may be color filters and filters 30C may be infrared filters. Providing this type of filtering capability may enhance system performance. If desired, photodiodes 20B in lower image sensor wafer 104W may be formed in a thick graded epitaxial substrate 34C, which can help significantly improve near-infrared sensitivity while minimizing pixel crosstalk of the system.

Various embodiments have been described illustrating an electronic device that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

An imaging system may include multiple image sensors that are stacked on top of one another. If desired, the image sensors in the stack may have different spectral sensitivities. For example, an upper image sensor may be configured to detect electromagnetic radiation within a first range of wavelengths (e.g., visible light), while a lower image sensor may be configured to detect electromagnetic radiation within a second range of wavelengths (e.g., infrared light).

Light guide channels may be formed in the upper image sensor to allow light to reach the photosensitive regions of the lower image sensor.

In another suitable embodiment, photosensitive regions in the lower image sensor do not receive channeled light but are instead used to absorb any radiation that is transmitted through the upper image sensor without being absorbed by the photosensitive regions in the upper image sensor. The upper image sensor may include some photosensitive regions that are sensitive to visible light and other photosensitive regions that are sensitive to infrared light. Additional photosensitive regions (which may be sensitive to infrared light or visible light) may be formed in the lower image sensor directly below the photosensitive regions of the first image sensor.

The upper and lower image sensors may both be backside illumination image sensors, may both be front side illumination image sensors, or may include one backside illumination image sensor and one front side illumination image sensor. The image sensors may be bonded and interconnected at the wafer level and may subsequently be diced to form singulated stacks of first and second image sensor dies.

The foregoing is merely illustrative of the principles of this invention and various modifications can be made by those skilled in the art. The foregoing embodiments may be implemented individually or in any combination.

What is claimed is:

1. An imaging system, comprising:
    a first image sensor having a first plurality of photodiodes, wherein the first plurality of photodiodes are formed in a first semiconductor layer, wherein the first image sensor comprises visible imaging pixels and upper infrared imaging pixels, and wherein each of the visible imaging pixels and the upper infrared imaging pixels includes one of the photodiodes in the first plurality of photodiodes;
    a second image sensor having a second plurality of photodiodes, wherein the second plurality of photodiodes are formed in a second semiconductor layer, wherein the first image sensor is stacked on top of and bonded to the second image sensor, wherein the second image sensor comprises lower infrared imaging pixels, wherein each of the lower infrared imaging pixels includes one of the photodiodes in the second plurality of photodiodes, and wherein the upper infrared imaging pixels directly overlap the lower infrared imaging pixels;
    a microlens array formed over the first and second pluralities of photodiodes; and
    an array of filter elements interposed between the microlens array and the first semiconductor layer, wherein the array of filter elements comprises color filter elements formed over at least some of the first plurality of photodiodes and infrared filter elements formed over the second plurality of photodiodes, wherein the color filter elements transmit visible light, and wherein the infrared filter elements transmit infrared light.

2. The imaging system defined in claim 1 wherein the upper infrared imaging pixels include respective wide band infrared filters and wherein the lower infrared imaging pixels include respective narrow band infrared filters.

3. An imaging system, comprising:
    a pixel array having infrared imaging pixels and visible imaging pixels, wherein the visible imaging pixels each include a photodiode formed in a first semiconductor substrate, wherein the infrared imaging pixels each include a photodiode formed in a second semiconductor substrate, and wherein the first semiconductor substrate overlaps and is mounted to the second semiconductor substrate;
    an oxide layer interposed between the first semiconductor substrate and the second semiconductor substrate;
    a conductive signal path that passes through the oxide layer and at least one of the first semiconductor substrate and the second semiconductor substrate, wherein the conductive signal path is electrically coupled between the first semiconductor substrate and the second semiconductor substrate; and
    a plurality of reflectors in the first semiconductor substrate, wherein each of the reflectors is located under a respective one of the visible imaging pixels, wherein the visible imaging pixels include red, green, and blue imaging pixels and wherein the reflectors are located only under the red and green imaging pixels.

4. The imaging system defined in claim 3 wherein the infrared imaging pixels comprise infrared filter elements that block visible light and wherein the visible imaging pixels comprise color filter elements that pass visible light.

5. The imaging system defined in claim 3 wherein at least some of the infrared imaging pixels are interspersed among the visible imaging pixels.

6. The imaging system defined in claim 3 wherein the blue imaging pixels directly overlap the infrared imaging pixels.

* * * * *